(12) United States Patent
Son et al.

(10) Patent No.: US 11,966,163 B2
(45) Date of Patent: Apr. 23, 2024

(54) PHOTOMASK FOR IMPRINTING AND MANUFACTURING METHOD THEREFOR

(71) Applicant: LG CHEM, LTD., Seoul (KR)

(72) Inventors: Yong Goo Son, Daejeon (KR); Seung Heon Lee, Daejeon (KR); Nam Seok Bae, Daejeon (KR)

(73) Assignee: LG CHEM, LTD., Seoul (KR)

( * ) Notice: Subject to any disclaimer, the term of this patent is extended or adjusted under 35 U.S.C. 154(b) by 481 days.

(21) Appl. No.: 16/975,068

(22) PCT Filed: Apr. 2, 2019

(86) PCT No.: PCT/KR2019/003862
§ 371 (c)(1),
(2) Date: Aug. 21, 2020

(87) PCT Pub. No.: WO2019/231097
PCT Pub. Date: Dec. 5, 2019

(65) Prior Publication Data
US 2021/0088909 A1    Mar. 25, 2021

(30) Foreign Application Priority Data

May 30, 2018   (KR) .................. 10-2018-0061683

(51) Int. Cl.
*G03F 7/20*     (2006.01)
*G03F 7/16*     (2006.01)
*H01L 21/027*   (2006.01)

(52) U.S. Cl.
CPC .................. *G03F 7/20* (2013.01); *G03F 7/16* (2013.01); *H01L 21/0274* (2013.01)

(58) Field of Classification Search
CPC ..... G03F 7/20; G03F 7/16; G03F 1/50; G03F 7/027; G03F 7/0002; G03F 7/168;
(Continued)

(56) References Cited

U.S. PATENT DOCUMENTS 5,614,336 A * 3/1997 Mikami .................... G03F 1/29
  430/323
7,341,825 B2 * 3/2008 Bandic .................. G03F 7/0002
  430/323
(Continued)

FOREIGN PATENT DOCUMENTS

JP    2006163309 A  *  6/2006
JP    2008-244081 A     10/2008
(Continued)

OTHER PUBLICATIONS

Cadarso, Víctor J., et al. "High-aspect-ratio nanoimprint process chains." Microsystems & Nanoengineering 3.1 (2017): 1-12. (Year: 2017).*

(Continued)

*Primary Examiner* — Mark F. Huff
*Assistant Examiner* — Moriah S. Smoot
(74) *Attorney, Agent, or Firm* — BRYAN CAVE LEIGHTON PAISNER LLP (57) ABSTRACT

An imprinting photomask including: a transparent substrate; a light blocking pattern provided on the transparent substrate; and a dry film resist (DFR) pattern provided on the light blocking pattern.

12 Claims, 8 Drawing Sheets

(58) Field of Classification Search
CPC ........ G03F 7/2004; G03F 7/2063; G03F 7/32; G03F 7/70691; H01L 21/0274
See application file for complete search history.

(56) References Cited

U.S. PATENT DOCUMENTS

| | | | |
|---|---|---|---|
| 2007/0158872 A1 | 7/2007 | Jeong et al. | |
| 2009/0317727 A1 | 12/2009 | Beck | |
| 2011/0294045 A1 | 12/2011 | Nagai et al. | |
| 2012/0152887 A1* | 6/2012 | Lee ........................ | B82Y 10/00 977/932 |
| 2013/0084352 A1 | 4/2013 | Suzuki et al. | |

FOREIGN PATENT DOCUMENTS

| | | | | |
|---|---|---|---|---|
| JP | 2008268483 A | * | 11/2008 | |
| JP | 2008296441 A | * | 12/2008 | |
| JP | 2009067004 A | * | 4/2009 | |
| JP | 2013-39757 A | | 2/2013 | |
| JP | 2017-103384 A | | 6/2017 | |
| JP | 2017103384 A | * | 6/2017 | |
| JP | 2018-14497 A | | 1/2018 | |
| JP | 2018049902 A | | 3/2018 | |
| KR | 10-2005-0112940 A | | 12/2005 | |
| KR | 10-2007-0042309 A | | 4/2007 | |
| KR | 10-2008-0003915 A | | 1/2008 | |
| KR | 10-2009-0019200 A | | 2/2009 | |
| KR | 20090019200 A | * | 2/2009 | |
| KR | 10-2009-0047146 A | | 5/2009 | |
| KR | 10-2010-0095392 A | | 8/2010 | |
| KR | 10-2013-0058081 A | | 6/2013 | |
| KR | 10-2013-0071426 A | | 6/2013 | |
| KR | 10-1671918 B1 | | 4/2016 | |
| KR | 10-2016-0145589 A | | 12/2016 | |
| KR | 10-2017-0112550 A | | 10/2017 | |
| WO | 2013/024833 A1 | | 2/2013 | |
| WO | 2015/159370 A1 | | 10/2015 | |
| WO | WO-2017018830 A1 | * | 2/2017 | ............... G03F 1/38 |
| WO | WO-2017131497 A1 | * | 8/2017 | ............... G03F 1/38 |

OTHER PUBLICATIONS

Helmut Schift et al., "Easy mask-mold fabrication for combined nanoimprint and photolithography," Journal of Vacuum Science and Technology B 27(6), 2009, pp. 2850-2853 (4 Pages).

Wen-Chang Liao et al., "High Aspect ratio pattern transfer in imprint lithography using a hybrid mold," Journal of Vacuum Science and Technology B 22 (6), 2004, pp. 2764-2767 (4 pages).

Xing Cheng et al., "A combined-nanoimprint-and-photolithography patterning technique," Microelectronic Engineering 71, 2004, pp. 277-282 (6 Pages).

* cited by examiner

PHOTOMASK FOR IMPRINTING AND MANUFACTURING METHOD THEREFOR

CROSS-REFERENCE TO RELATED APPLICATIONS

This application is a U.S. national stage of international Application No. PCT/KR2019/003862, filed Apr. 2, 2019, and claims priority to and the benefit of Korean Patent Application No. 10-2018-0061683 filed with the Korean Intellectual Property Office on May 30, 2018, the entire contents of which are incorporated herein by reference.

TECHNICAL FIELD

The present application relates to an imprinting photomask and a method of manufacturing the same.

BACKGROUND

An electrophoretic variable transmittance film is a functional film in which light transmittance is adjusted as positively or negatively charged particles are concentrated or dispersed on a specifically formed electrode in accordance with a direction and intensity of an electric field formed between two electrode substrates which are oppositely charged. It is easy to transmit and block light entering from the outside in the electrophoretic variable transmittance film and thus can be used as a smart window for building, for example, a sunroof for a vehicle, and a light blocking film for a transparent display.

It is essential to maintain a cell gap between two electrode substrates in order to uniformly distribute a solution with charged particles between the two electrode substrates. To this end, a partition wall pattern needs to be provided on at least one of the two electrode substrates.

As a height and an aspect ratio of the partition wall pattern are increased in order to implement the partition wall pattern, it is difficult to implement a required pattern shape just by using a general photolithography process.

Therefore, there is a need for technology development on a manufacturing method capable of increasing a height and an aspect ratio of a partition wall pattern in this technical field.

SUMMARY

The present application has been made in an effort to provide an imprinting photomask and a method of manufacturing the same.

An exemplary embodiment of the present application provides an imprinting photomask comprising: a transparent substrate; a light blocking pattern provided on the transparent substrate; and a dry film resist (DFR) pattern provided on the light blocking pattern.

In addition, another exemplary embodiment of the present application provides a method of manufacturing an imprinting photomask, the method comprising: forming a light blocking layer on a transparent substrate; forming a dry film resist pattern on the light blocking layer; and forming a light blocking pattern by etching the light blocking layer by using the dry film resist pattern as a mask.

In addition, still another exemplary embodiment of the present application provides a method of manufacturing a partition wall pattern, the method comprising: forming a UV-curable resin layer on a substrate; and forming a partition wall pattern by using the imprinting photomask and performing an imprinting photo process on the UV-curable resin layer.

According to the exemplary embodiment of the present application, it is possible to provide the imprinting photomask in which a ratio of a thickness of the light blocking pattern and the dry film resist pattern to a distance between adjacent light blocking patterns is 1 or more.

In addition, according to the exemplary embodiment of the present application, the light blocking pattern is provided between the transparent substrate and the dry film resist pattern, and as a result, it is possible to prevent a pin hole formed in the light blocking layer and damage to a mold pattern which are problems in the related art.

In addition, according to the exemplary embodiment of the present application, the partition wall pattern is manufactured by using the imprinting photomask, and as a result, it is possible to manufacture the partition wall pattern satisfying a thickness of 10 μm or more and an aspect ratio of 1 or more.

REFERENCE NUMERALS DESCRIBED HEREIN

10: Transparent substrate
20: Light blocking pattern
30: Dry film resist pattern
40: Release layer
50: Light blocking layer
60: Dry film resist 70: UV-curable resin layer
80: Partition wall pattern
90: Substrate
100: Distance between adjacent light blocking patterns
110: Sum of thickness of light blocking pattern and thickness of dry film resist pattern

DETAILED DESCRIPTION

Hereinafter, the present application will be described in detail.

In the present application, the term "transparent" means that transmittance is about 80% or higher in a visible ray region (400 nm to 700 nm).

Typically, it is essential to use a transparent electrode film and a metal pattern electrode film in order to manufacture an electrophoretic variable transmittance film. In addition, a cell gap needs to be maintained in order to inject an electrophoretic substance such as a negatively (−) charged carbon black particle dispersed solution between the two electrode films. To this end, a ball spacer, a column spacer pattern, or a partition wall pattern needs to be provided.

In a case in which a photolithography process using a photosensitive resin composition is applied to manufacture the partition wall pattern, there is a limitation in implementing a partition wall pattern having a uniform line width in a large area. This is due to uniformity of an exposure gap between a photomask and a photosensitive resin composition layer and uniformity of application of the photosensitive resin composition layer.

A height and an aspect ratio of the partition wall pattern are increased as described above in order to implement the partition wall pattern, but it is difficult to implement a required pattern shape just by using a general photolithography process.

The use of a method using an imprinting process can be considered in order to form a partition wall pattern having a large level difference and a large aspect ratio. However, there is a problem in that a resin composition remains in a region other than a region of the partition wall pattern during a general imprinting process. A de-scum process is added to remove the remaining resin composition, which causes a problem in that manufacturing costs are increased.

In addition, a method of selectively introducing a light blocking layer on an embossed portion of an imprinting mold can be considered to solve the problem, but there are problems in that a pin hole can be formed and a mold pattern can be damaged during a process of depositing the light blocking layer on the imprinting mold, and a separate resist transfer process and an etching process are added to selectively remove the light blocking layer unnecessarily deposited on a debossed portion of the imprinting mold.

Therefore, the present application is intended to provide an imprinting photomask and a method of manufacturing the same which are capable of manufacturing a partition wall pattern having a large level difference and a large aspect ratio.

An imprinting photomask according to an exemplary embodiment of the present application comprises: a transparent substrate; a light blocking pattern provided on the transparent substrate; and a dry film resist (DFR) pattern provided on the light blocking pattern.

In the exemplary embodiment of the present application, the transparent substrate can be, but is not limited to, a glass base or a transparent plastic base which is excellent in transparency, surface smoothness, tractability, and waterproofness, and the transparent base is not limited as long as the transparent base is typically used for electronic elements. Specifically, the transparent base can be made of glass; urethane resin; polyimide resin; polyester resin; (meth) acrylate-based polymeric resin; or polyolefin-based resin such as polyethylene or polypropylene.

In the exemplary embodiment of the present application, the light blocking pattern can comprise one or more of Cu, Al, Cr, Ni, and an alloy thereof.

A distance between adjacent light blocking patterns can be 30 μm or less, or 5 μm to 30 μm. If the distance between adjacent light blocking patterns is more than 30 μm, there can be a problem in that a line width of a partition wall pattern manufactured by an imprinting photo process is excessively increased, and a variable transmittance range of a variable transmittance film is decreased. In addition, if the distance between the adjacent light blocking patterns is less than 5 μm, a distance between the DFR patterns on the light blocking layer needs to be less than 5 μm to form the light blocking pattern, but this cannot be implemented just by a general exposure device using parallel light.

In addition, a thickness of the light blocking pattern can be 1 μm or less, or 0.1 μm to 1 μm. If the thickness of the light blocking pattern is more than 1 μm, there can be a problem in that the line width of the light blocking pattern is excessively decreased in comparison with the dry film resist pattern after etching the light blocking layer, and an undercut is formed at a lower portion of the dry film resist pattern. In this case, there can be a problem in that the partition wall pattern, which is completely cured during the process of forming the partition wall pattern, is not detached from the imprinting photomask. If the thickness of the light blocking pattern is less than 0.1 μm, there can be a problem in that many pin holes are formed in the light blocking layer. Therefore, the thickness of the light blocking pattern can be 0.1 μm or more.

In the present application, the distance between the adjacent light blocking patterns means a shortest distance from one lateral surface of one light blocking pattern to one lateral surface of another adjacent light blocking pattern. In addition, the thickness of the light blocking pattern means a distance from an interface of the light blocking pattern, which is in contact with the transparent substrate, to a surface opposite to the interface.

Figure 8:
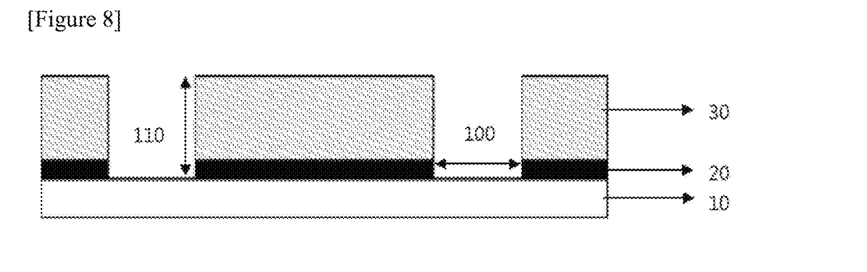
FIG. 8 is a schematic illustration of a distance between adjacent light blocking patterns and a thickness of the light blocking pattern according to an exemplary embodiment of the present application.

FIG. 8 illustrates a distance 100 between adjacent light blocking patterns according to an exemplary embodiment of the present application.

In an exemplary embodiment of the present application, the dry film resist can be provided on the light blocking pattern and disposed in a region corresponding to the light blocking pattern.

The dry film resist can comprise a material known in this technical field. More specifically, the dry film resist can be made of a mono-functional monomer selected from a group consisting of methacrylate and a derivative thereof, acrylate and a derivative thereof, methacrylic oxyethyl acid phosphate, and methacrylate of a phthalic acid derivative; a multifunctional monomer selected from a group consisting of dimethacrylate and a derivative thereof, a diacrylate and a derivative thereof, trimethacrylate and a derivative thereof, tetramethacrylate and a derivative thereof, triacrylate and a derivative thereof, and tetraacrylate and a derivative thereof; and a photopolymeric monomer selected from mixtures thereof. In general, a composition of a photosensitive layer of the dry film resist can comprise a photopolymeric monomer (multifunctional monomer) which is photopolymerized by light, a photopolymeric initiator which induces a radical by light to generate photopolymerization, a binder polymer which provides mechanical strength, tending, and adhesiveness of a photopolymeric composition, and an additive such as a dye, a stabilizer, an adhesiveness promoter, and a thermal polymerization preventing agent.

In the exemplary embodiment of the present application, a sum of a thickness of the light blocking pattern and a thickness of the dry film resist pattern can be 10 μm or more, or 10 μm to 50 μm.

In the present application, the sum of the thickness of the light blocking pattern and the thickness of the dry film resist pattern means a distance from the interface of the light blocking pattern, which is in contact with the transparent substrate, to a surface opposite to an interface of the dry film resist pattern which is in contact with the light blocking pattern.

FIG. 8 illustrates a sum 110 of the thickness of the light blocking pattern and the thickness of the film resist pattern according to an exemplary embodiment of the present application.

In addition, a ratio of a thickness of the light blocking pattern and the dry film resist pattern to the distance between adjacent light blocking patterns can be 1 or more, or 1 to 3. If the ratio of the thickness of the light blocking pattern and the dry film resist pattern to the distance between adjacent light blocking patterns is 1 or less, there can be a problem in that a variable transmittance range is decreased as an area of the partition wall pattern manufactured by the imprinting photo process is increased.

In an exemplary embodiment of the present application, a release layer can be further provided on an entire surface of the imprinting photomask.

The release layer can be implemented as a layer with a mixture of fluorine-based and silicon-based release materials, and a thickness of the release layer can be, but is not limited to, 100 nm or less. Examples of a method of forming the release layer comprise a wet coating method, a vapor deposition method, and the like, and the vapor deposition method is advantageous in implementing a uniform release layer on a surface having a level difference.

With the implementation of the release layer, a UV-curable resin pattern, which is cured by the imprinting photo process, can be easily separated from the imprinting photomask.

Figure 1:
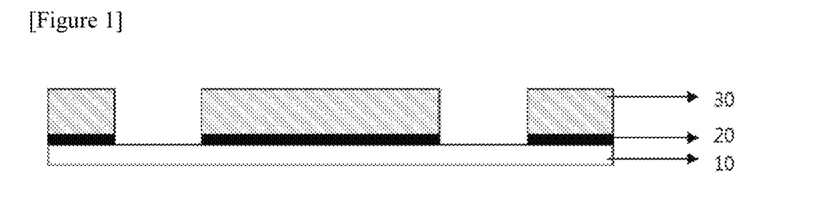
FIGS. 1 and 2 are schematic illustrations of an imprinting photomask according to exemplary embodiments of the present application.
Figure 2:
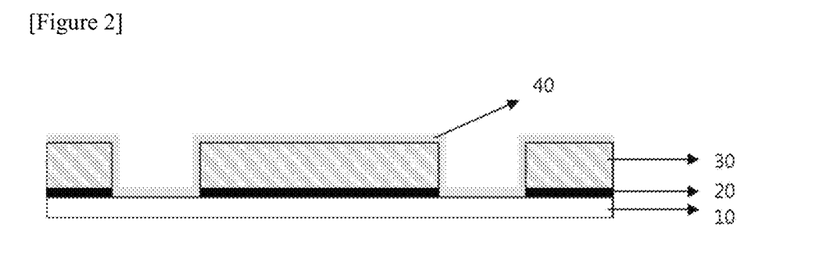

The imprinting photomask according to an exemplary embodiment of the present application is schematically illustrated in FIGS. 1 and 2. As illustrated in FIG. 1, the imprinting photomask according to an exemplary embodiment of the present application comprises: a transparent substrate 10; a light blocking pattern 20 provided on the transparent substrate 10; and a dry film resist pattern 30 provided on the light blocking pattern 20. In addition, as illustrated in FIG. 2, the imprinting photomask according to an exemplary embodiment of the present application can further comprise a release layer 40 provided on an entire surface of the imprinting photomask.

In addition, a method of manufacturing the imprinting photomask according to an exemplary embodiment of the present application comprises: forming a light blocking layer on a transparent substrate; forming a dry film resist pattern on the light blocking layer; and forming a light blocking pattern by etching the light blocking layer by using the dry film resist pattern as a mask.

In an exemplary embodiment of the present application, the forming of the light blocking layer on the transparent substrate can use a method known in this technical field. More specifically, the forming of the light blocking layer on the transparent substrate can use, but is not limited to, a deposition process.

In an exemplary embodiment of the present application, the forming of the dry film resist pattern on the light blocking layer can comprise: laminating a dry film resist on the light blocking layer; and forming the dry film resist pattern by using a photo process and a development process.

In an exemplary embodiment of the present application, the method can further comprise forming a release layer on an entire surface of the imprinting photomask after the forming of the light blocking pattern. The forming of the release layer on the entire surface of the imprinting photomask can use a method known in this technical field. More specifically, the forming of the release layer on the entire surface of the imprinting photomask can use, but is not limited to, a deposition process.

According to an exemplary embodiment of the present application, a separate resist transfer process is not required because the light blocking layer is formed on the transparent substrate and then the dry film resist pattern is formed on the light blocking layer. That is, according to the exemplary embodiment of the present application, the dry film resist pattern can serve as both an imprinting mold and a resist for selectively etching the light blocking layer.

Figure 3A:
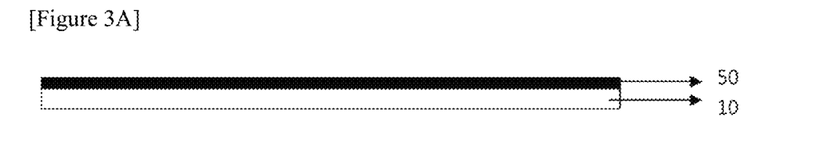
FIGS. 3A to 3F schematically illustrate a method of manufacturing an imprinting photomask according to an exemplary embodiment of the present application.
Figure 3B:
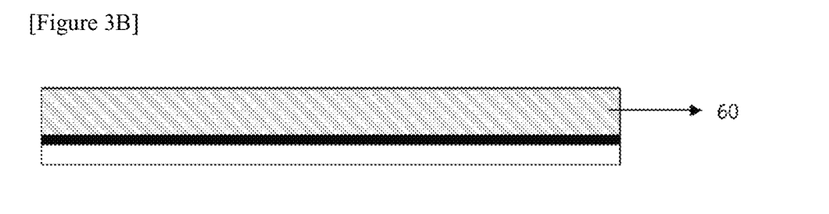
Figure 3C:
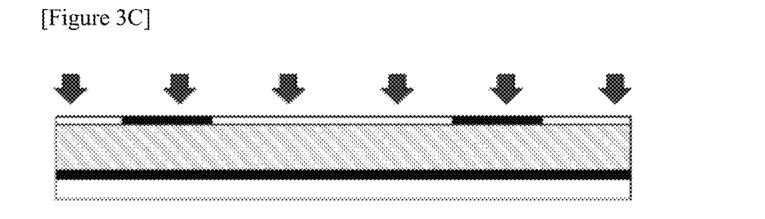
Figure 3D:
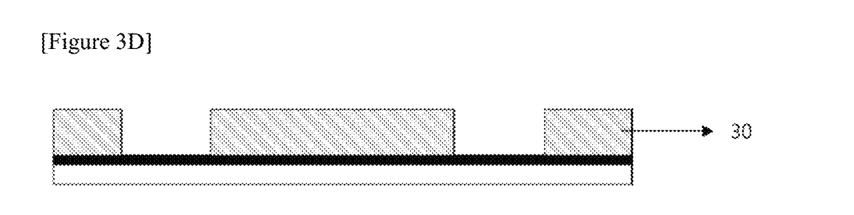
Figure 3E:
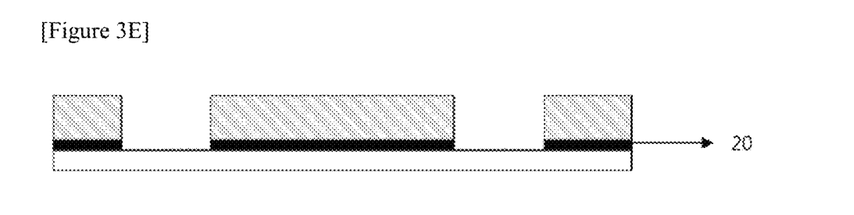
Figure 3F:
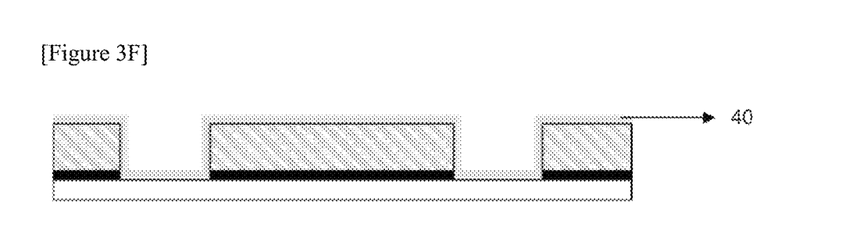

The method of manufacturing the imprinting photomask according to an exemplary embodiment of the present application is schematically illustrated in FIGS. 3A to 3F. As illustrated in FIGS. 3A to 3F, the method of manufacturing includes: forming light blocking layer on transparent substrate (FIG. 3A); laminating DFR (FIG. 3B); performing a photo process (FIG. 3C); developing the DFR (FIG. 3D); selectively etching the light blocking layer (FIG. 3E); and forming a release layer (FIG. 3F).

In addition, a method of manufacturing the partition wall pattern according to an exemplary embodiment of the present application comprises: forming a UV-curable resin layer on a substrate; and forming a partition wall pattern by using the imprinting photomask and performing an imprinting photo process on the UV-curable resin layer.

In an exemplary embodiment of the present application, the UV-curable resin layer can be made by using a material known in this technical field. More specifically, the UV-curable resin layer can comprise, but is not limited to, one or more of an acrylic monomer, an acrylic oligomer, and a photoinitiator.

In an exemplary embodiment of the present application, a thickness of the partition wall pattern can be 10 μm or more, or 10 μm to 50 μm. In addition, a line width of the partition wall pattern can be 30 μm or less, or 5 μm to 30 μm.

In addition, a ratio of a thickness of the partition wall pattern to the line width of the partition wall pattern can be 1 or more, or 1 to 3.

Figure 4A:
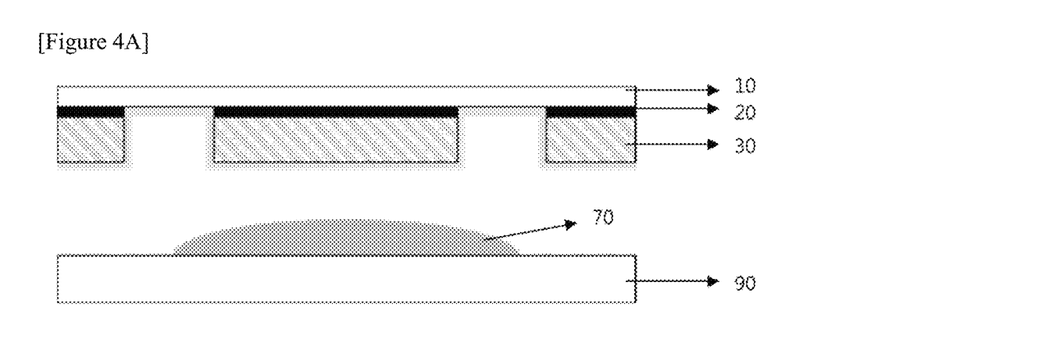
FIGS. 4A to 4D schematically illustrate a method of manufacturing a partition wall pattern according to an exemplary embodiment of the present application.
Figure 4B:
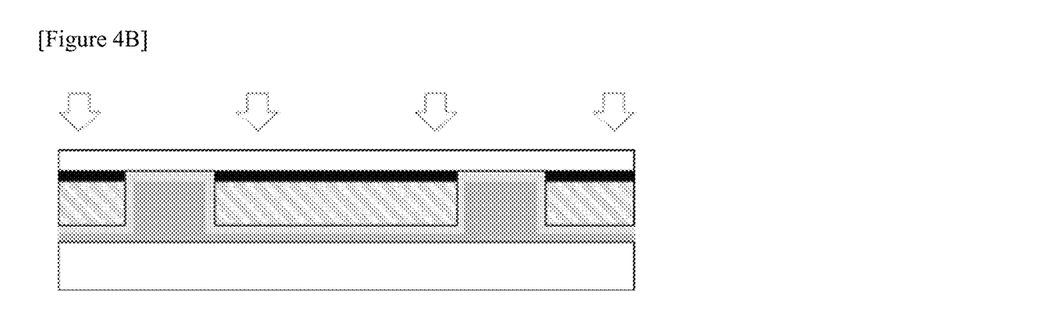
Figure 4C:
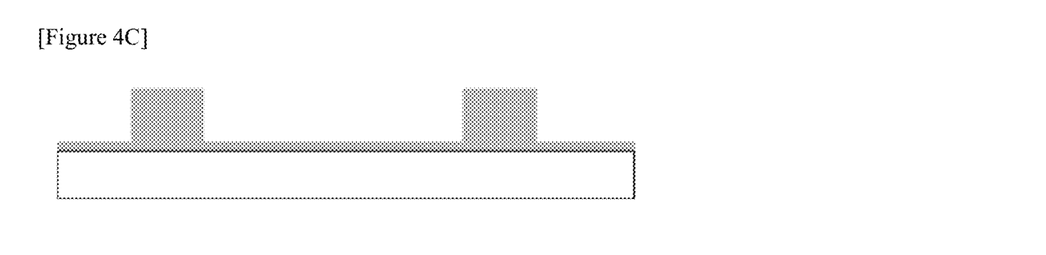
Figure 4D:
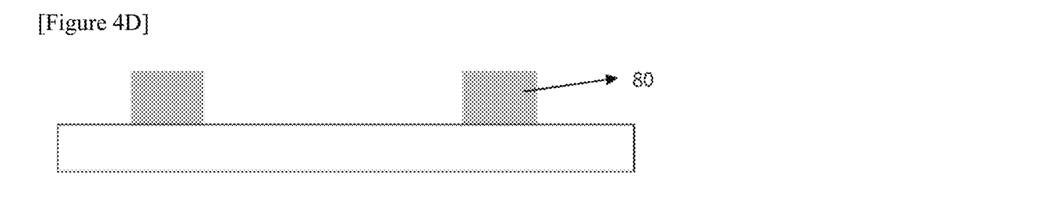

The method of manufacturing the partition wall pattern according to an exemplary embodiment of the present application is schematically illustrated in FIGS. 4A to 4D. As illustrated in FIGS. 4A to 4D, the method of manufacturing the partition wall includes: forming a UV-curable resin layer on a substrate (FIG. 4A); imprinting using a photo process (FIG. 4B); removing the photomask (FIG. 4C); and performing a development process (FIG. 4D).

In addition, an exemplary embodiment of the present application provides a variable transmittance film comprising the partition wall pattern.

The variable transmittance film according to an exemplary embodiment of the present application can be formed by using a material and a method known in this technical field, except that the variable transmittance film comprises the above-mentioned partition wall pattern.

For example, the variable transmittance film can have a second transparent substrate having a second electrode pattern provided on the partition wall pattern film. Negatively (−) charged nanoparticles are comprised between an electrode layer and the second electrode pattern of the partition wall pattern.

The negatively (−) charged nanoparticle can be, but is not limited to, a carbon black nanoparticle.

The variable transmittance film can be manufactured by using, but is not limited to, a method of preparing the above-mentioned variable transmittance film, and then injecting a solution, in which the negatively (−) charged nanoparticles are dispersed, between the electrode layer and the second electrode pattern of the partition wall pattern.

In the present application, the variable transmittance film can be operated by electrophoresis. The transmittance is decreased when the variable transmittance film according to an exemplary embodiment of the present application is in an OFF mode. The transmittance can be increased as the negatively (−) charged nanoparticles are concentrated on the metal pattern, which is a positive (+) electrode, due to the electrophoresis, in an ON mode in which a voltage is applied to the electrode layer and the second electrode pattern.

Hereinafter, the exemplary embodiment disclosed in the present specification will be described with reference to Examples. However, the scope of the exemplary embodiment is not intended to be limited by the following Examples.

EXAMPLES

Experimental Example 1

1) Manufacture of Imprinting Photomask

Cu having a thickness of 200 nm was formed on a PET film having a thickness of 250 μm by using a vacuum deposition method. A DFR (Asahi Kasei Corp.) having a thickness of 25 μm was roll-laminated on the Cu-deposited film under a condition in which a temperature was 110° C., a pressure was 0.4 MPa, and a roll speed was 1.5 m/min. A surface of the laminate, where the DFR was provided, and a photomask, which had a line width of 25 μm, a line spacing of 500 μm, and a dot pattern at a central portion thereof, were laminated at room temperature, and then exposed under a condition of 150 mJ/cm$^2$ by using an exposure device using parallel light with a wavelength of 365 nm. A DFR pattern, which had a debossed portion having a line width of 21 μm and a depth of 25 μm and had a line width of 500 μm, was formed by spray-developing the completely exposed laminate for 2 minutes by using an aqueous solution having Na$_2$CO$_3$ of 1 wt. %.

Figure 5A:
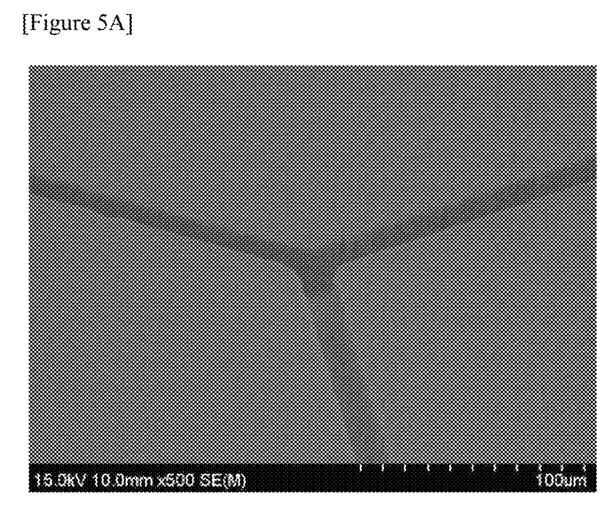
FIGS. 5A and 5B are scanning electron microscopy (SEM) image after a process of developing a dry film resist and a reflection mode image of an imprinting photomask of Experimental Example 1 according to an exemplary embodiment of the present application.
Figure 5B:
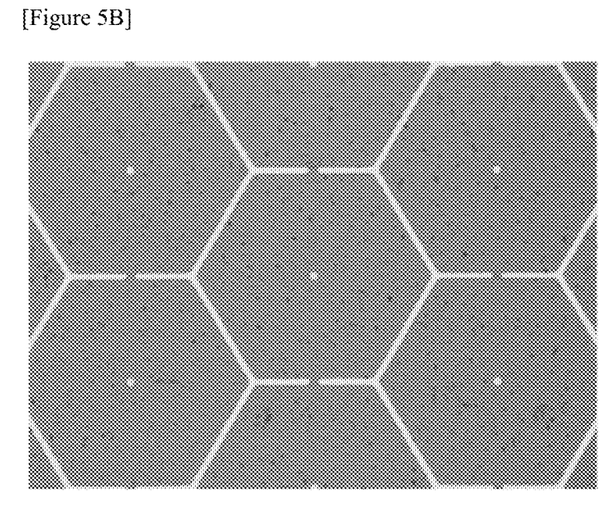

An image of the dry film resist after the development process is illustrated in FIGS. 5A and 5B.

A Cu layer, which was exposed in a region where no DFR was provided, was etched through spray etching for 30 seconds by using an aqueous solution having ferric chloride of 5 wt. %.

An imprinting photomask was completely manufactured by forming a release layer, which had a mixture of fluorine-based and silicon-based release materials and had a thickness of 100 nm, by using a vapor deposition method, on a DFR pattern film from which the Cu layer was selectively etched. A structure of the manufactured imprinting photomask is illustrated in FIG. 2

Figure 6A:
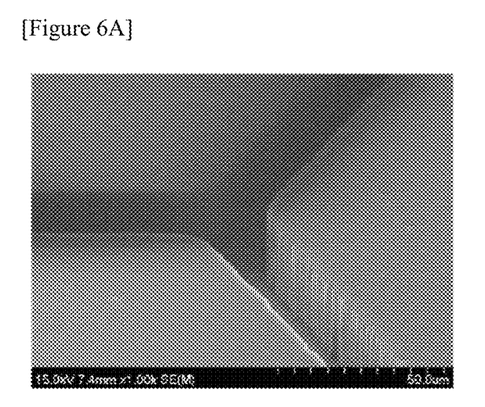
FIGS. 6A to 6C are an SEM image, a light transmitting mode image, and a reflection mode image of an imprinting photomask of Experimental Example 1 according to an exemplary embodiment of the present application.
Figure 6B:
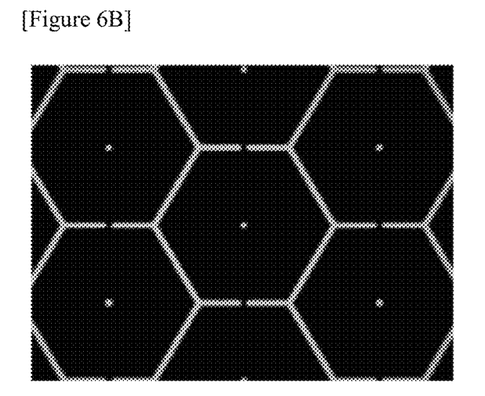
Figure 6C:
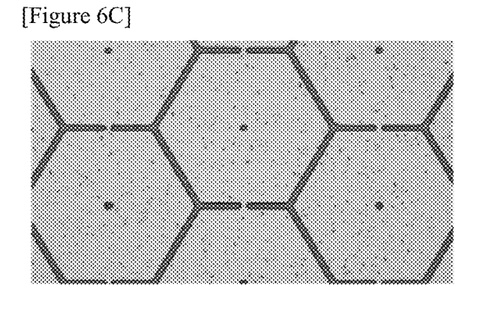

FIGS. 6A to 6C is an SEM image (FIG. 6A), a light transmitting mode image (FIG. 6B), and a reflection mode image (FIG. 6C) of the imprinting photomask. The reflection mode means that lighting is positioned above the imprinting photomask, and reflected light is recognized by means of an image (a difference in reflectance is imaged). The light transmitting mode means that lighting is positioned rearward from the imprinting photomask, and a region where light is transmitted and a region where light is blocked are recognized by means of an image (a difference in absorptivity is imaged).

2) Manufacture of Transparent UV-Curable Resin Composition

A transparent UV-curable resin composition was manufactured with compositions shown in Table 1.

TABLE 1

| Product Name | Manufacturer | Content (wt. %) |
|---|---|---|
| CN9010 NS (Alicyclic urethane acrylate monomer) | Sartomer | 28.5 |
| CN8004 (Alicyclic urethane acrylate monomer) | Sartomer | 28.5 |
| SR444NS (Pentaerythritol triacrylate) | Sartomer | 38 |
| Irgacure 184 (Photoinitiator) | Ciba | 4 |
| SR9051 (Attachment force enhancer) | Sartomer | 1 |
| Sum | | 100 |

3) Manufacture of Partition Wall Pattern Film

The transparent UV-curable resin composition was applied onto an ITO film having surface resistance of 150 Ω/sq., and then the imprinting photomask was roll-pressed with a pressure of 0.5 MPa and at a rate of 0.1 mpm. The ITO film having a partition wall pattern was manufactured by irradiating the laminate, from above thereof, with exposure energy of 250 mJ/cm2 by using a UV curing device with a wavelength of 365 nm and then separating the imprinting photomask from the ITO film.

The partition wall pattern manufactured by the imprinting photo process had a line width of 21.2 μm, a height of 25 μm, and a line spacing of 500 μm.

Figure 7A:
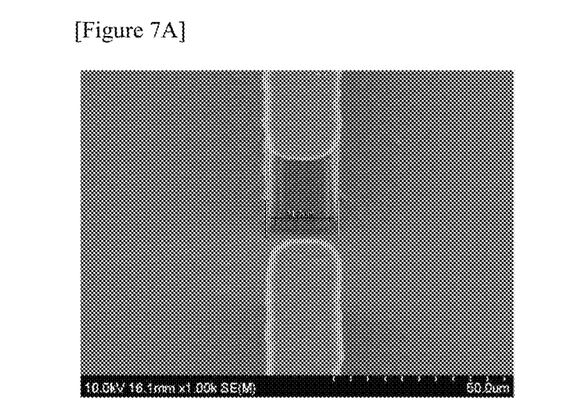
FIGS. 7A to 7C are SEM images of a partition wall pattern of Experimental Example 1 according to an exemplary embodiment of the present application.
Figure 7B:
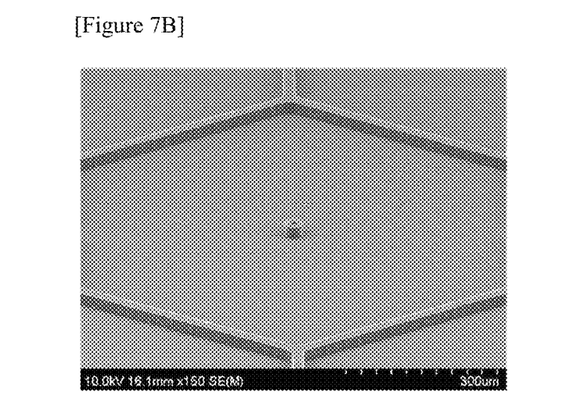
Figure 7C:
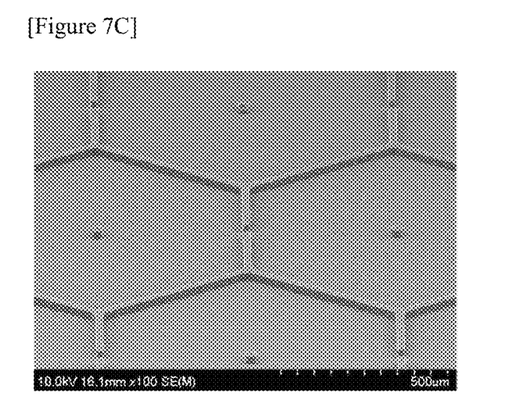

FIGS. 7A to 7C are SEM images of the partition wall pattern.

Experimental Example 2

1) Manufacture of Imprinting Photomask

An imprinting photomask was manufactured by a method identical to a method of Experimental Example 1 except that a DFR (Asahi Kasei Corp.) having a thickness of 50 μm was used (a line width of a debossed portion was 20 μm, a line width of a DFR pattern was 500 μm, and a depth of the debossed portion was 50 μm). A structure of the manufactured imprinting photomask is illustrated in FIG. 2.

2) Manufacture of Transparent UV-Curable Resin Composition

A transparent UV-curable resin composition was manufactured by a method identical to the method of Experimental Example 1.

3) Manufacture of Partition Wall Pattern Film

A partition wall pattern film was manufactured by a method identical to the method of Experimental Example 1.

The partition wall pattern manufactured by the imprinting photo process had a line width of 20 μm, a height of 50 μm, and a line spacing of 500 μm.

Experimental Example 3

1) Manufacture of Imprinting Photomask

Cu having a thickness of 8 μm was formed on a PET film having a thickness of 250 μm by using an electroplating method. A DFR (Asahi Kasei Corp.) having a thickness of 25 μm was roll-laminated on the Cu-plated film under a condition in which a temperature was 110° C., a pressure was 0.4 MPa, and a roll speed was 1.5 m/min. A surface of the laminate, where the DFR was provided, and a photomask, which had a line width of 25 μm, a line spacing of 500 μm, and a dot pattern at a central portion thereof, were laminated at room temperature, and then exposed under a condition of 150 mJ/cm$^2$ by using an exposure device using parallel light with a wavelength of 365 nm. A DFR pattern, which had a debossed portion having a line width of 20 μm and a depth of 25 μm and had a line width of 500 μm, was formed by spray-developing the completely exposed laminate for 2 minutes by using an aqueous solution having Na$_2$CO$_3$ of 1 wt. %.

A Cu layer, which was exposed in a region where no DFR was provided, was etched through spray etching for 180 seconds by using an aqueous solution having ferric chloride of 5 wt. %.

Figure 9:
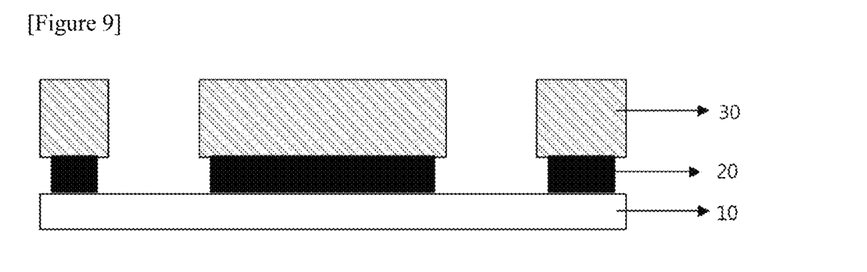
FIG. 9 is a schematic illustration of an imprinting photomask of Experimental Example 3 according to an exemplary embodiment of the present application.

An imprinting photomask was completely manufactured by forming a release layer, which had a mixture of fluorine-based and silicon-based release materials and had a thickness of 100 nm, by using a vapor deposition method, on a DFR pattern film from which the Cu layer was selectively etched. A structure of the manufactured imprinting photomask is illustrated in FIG. 9.

2) Manufacture of Transparent UV-Curable Resin Composition

A transparent UV-curable resin composition was manufactured by a method identical to the method of Experimental Example 1.

3) Manufacture of Partition Wall Pattern Film

A partition wall pattern film was manufactured by a method identical to the method of Experimental Example 1, but it was impossible to implement a pattern because the partition wall pattern was not separated from the imprinting photomask.

According to a result of Experimental Example 3, if the thickness of the light blocking pattern is more than 1 μm, there can be a problem in that the line width of the light blocking pattern is excessively decreased in comparison with the dry film resist pattern after etching the light blocking layer, such that an undercut is formed at a lower portion of the dry film resist pattern, as illustrated in FIG. 9. In this case, there can be a problem in that the partition wall pattern, which is completely cured during the process of forming the partition wall pattern, is not detached from the imprinting photomask.

Therefore, in the exemplary embodiment of the present application, the thickness of the light blocking pattern can be 1 μm or less.

Experimental Example 4

1) Manufacture of Imprinting Photomask

A DFR (Asahi Kasei Corp.) having a thickness of 25 μm was roll-laminated on a PET film having a thickness of 250 μm under a condition in which a temperature was 110° C., a pressure was 0.4 MPa, and a roll speed was 1.5 m/min. A surface of the laminate, where the DFR was provided, and a photomask, which had a line width of 25 μm, a line spacing of 500 μm, and a dot pattern at a central portion thereof, were laminated at room temperature, and then exposed under a condition of 150 mJ/cm$^2$ by using an exposure device using parallel light with a wavelength of 365 nm. A DFR pattern, which had a debossed portion having a line width of 20 μm and a depth of 25 μm and had a line width of 500 μm, was formed by spray-developing the completely exposed laminate for 2 minutes by using an aqueous solution having Na$_2$CO$_3$ of 1 wt. %.

Cu having a thickness of 200 nm was formed on the laminate by using a vacuum deposition method, and then an etching resist layer was formed on an embossed portion of the laminate by using a reverse offset printing process.

A Cu layer, which was exposed in a region where no etching resist layer was provided, was etched through spray etching for 30 seconds by using an aqueous solution having ferric chloride of 5 wt. %.

Figure 10:
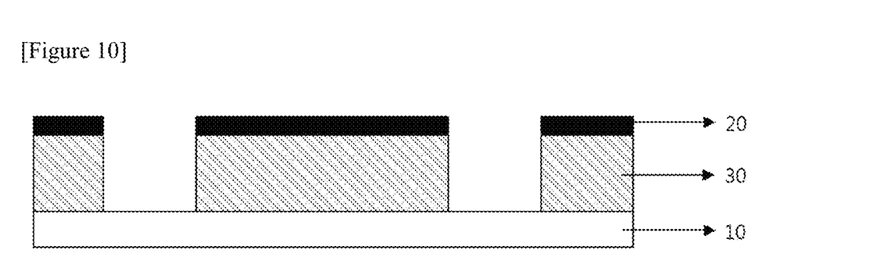
FIG. 10 is a schematic illustration of an imprinting photomask of Experimental Example 4 according to an exemplary embodiment of the present application.

An imprinting photomask was completely manufactured by forming a release layer, which had a mixture of fluorine-based and silicon-based release materials and had a thickness of 100 nm, by using a vapor deposition method, on a DFR pattern film from which the Cu layer was selectively etched. A structure of the manufactured imprinting photomask is illustrated in FIG. 10.

2) Manufacture of Transparent UV-Curable Resin Composition

A transparent UV-curable resin composition was manufactured by a method identical to the method of Experimental Example 1.

3) Manufacture of Partition Wall Pattern Film

A partition wall pattern film was manufactured by a method identical to the method of Experimental Example 1.

The partition wall pattern manufactured by the imprinting photo process had a line width of 20 μm, a height of 25 μm, and a line spacing of 500 μm.

Experimental Example 5

Figure 11:
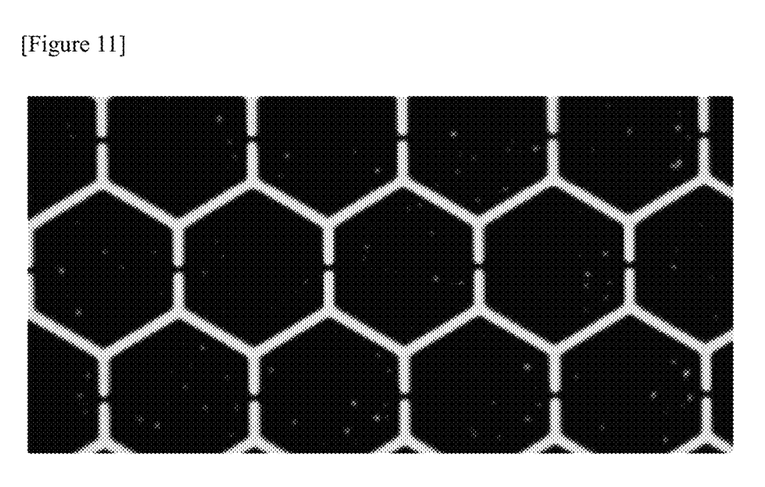
FIG. 11 is light transmitting mode image of the imprinting photomask of Experimental Example 4 according to an exemplary embodiment of the present application.

Properties of the imprinting photomasks, evaluation of pin hole defects of the light blocking patterns, and pattern forming properties with respect to Experimental Examples 1 to 4 are shown in Table 2. In addition, FIG. 11 is a light transmitting mode image of the imprinting photomask according to Experimental Example 4.

TABLE 2

| | Experimental Example 1 | Experimental Example 2 | Experimental Example 3 | Experimental Example 4 |
|---|---|---|---|---|
| Distance between adjacent light blocking patterns (μm) | 20 | 20 | 20 | 20 |
| Thickness of DFR (μm) | 25 | 50 | 25 | 25 |
| Thickness of light blocking pattern (μm) | 0.2 | 0.2 | 8 | 0.2 |
| Aspect ratio | 1.26 | 2.51 | 1.65 | 1.26 |
| Pin hole defect of light blocking pattern | Good | Good | Good | Poor |

TABLE 2-continued

| | Experimental Example 1 | Experimental Example 2 | Experimental Example 3 | Experimental Example 4 |
|---|---|---|---|---|
| Pattern forming properties | Good | Good | Poor (No pattern detachment) | Poor (Residue formed) |

Aspect ratio: (Thickness of DFR+Thickness of light blocking pattern)/Distance between adjacent light blocking patterns As can be seen in the above results, according to the exemplary embodiment of the present application, it is possible to provide the imprinting photomask in which a ratio of a thickness of the light blocking pattern and the dry film resist pattern to a distance between the adjacent light blocking patterns is 1 or more.

In addition, according to the exemplary embodiment of the present application, the light blocking pattern is provided between the transparent substrate and the dry film resist pattern, and as a result, it is possible to prevent a pin hole formed in the light blocking layer and damage to a mold pattern which are problems in the related art.

In addition, according to the exemplary embodiment of the present application, the partition wall pattern is manufactured by using the imprinting photomask, and as a result, it is possible to manufacture the partition wall pattern satisfying a thickness of 10 μm or more and an aspect ratio of 1 or more.

The invention claimed is:

1. An imprinting photomask, comprising:
   a transparent substrate;
   a light blocking pattern provided on the transparent substrate; and
   a dry film resist pattern provided on the light blocking pattern and corresponding to the light blocking pattern,
   wherein a thickness of the light blocking pattern is 0.1 μm to 1 μm and a sum of a thickness of the light blocking pattern and a thickness of the dry film resist pattern is 20 μm to 50 μm, and
   wherein a ratio of the sum of the thickness of the light blocking pattern and the thickness of the dry film resist pattern to a distance between adjacent portions of the light blocking patterns is 1 or more, and
   wherein a distance between adjacent portions of the light blocking pattern is 5 μm to 30 μm.

2. The imprinting photomask of claim 1, wherein the light blocking pattern comprises one or more selected from the group consisting of Cu, Al, Cr, Ni, and an alloy thereof.

3. The imprinting photomask of claim 1, further comprising:
   a release layer provided on an entire surface of the imprinting photomask.

4. A method of manufacturing an imprinting photomask, the method comprising:
   forming a light blocking layer on a transparent substrate;
   forming a dry film resist pattern on the light blocking layer and corresponding to the light blocking pattern; and
   forming a light blocking pattern by etching the light blocking layer by using the dry film resist pattern as a mask,
   wherein a thickness of the light blocking pattern is 0.1 μm to 1 μm and a sum of a thickness of the light blocking pattern and a thickness of the dry film resist pattern is 20 μm to 50 μm,
   wherein a ratio of the sum of the thickness of the light blocking pattern and the thickness of the dry film resist pattern to a distance between adjacent portions of the light blocking patterns is 1 or more, and
   wherein a distance between adjacent portions of the light blocking pattern is 5 μm to 30 μm or less.

5. The method of claim 4, wherein the forming of the dry film resist pattern on the light blocking layer comprises:
   laminating a dry film resist on the light blocking layer; and
   forming the dry film resist pattern by using a photo process and a development process.

6. The method of claim 4, further comprising:
   forming a release layer on an entire surface of the imprinting photomask after the forming of the light blocking pattern.

7. A method of manufacturing a partition wall pattern, the method comprising:
   forming a UV-curable resin layer on a substrate; and
   forming a partition wall pattern by using the imprinting photomask according to claim 1 and performing an imprinting photo process on the UV-curable resin layer.

8. The method of claim 7, wherein a thickness of the partition wall pattern is 10 μm or more.

9. The method of claim 7, wherein a ratio of a thickness of the partition wall pattern to a line width of the partition wall pattern is 1 or more.

10. The imprinting photomask of claim 1, wherein the ratio of the sum of the thickness of the light blocking pattern and the thickness of the dry film resist pattern to the distance between adjacent portions of the light blocking patterns is 1 to 3.

11. The method of claim 4, wherein the ratio of the sum of the thickness of the light blocking pattern and the thickness of the dry film resist pattern to the distance between adjacent portions of the light blocking patterns is 1 to 3.

12. The method of claim 7, wherein the ratio of the sum of the thickness of the light blocking pattern and the thickness of the dry film resist pattern to the distance between adjacent portions of the light blocking patterns is 1 to 3.

* * * * *